(12) United States Patent
Imai et al.

(10) Patent No.: US 6,262,393 B1
(45) Date of Patent: Jul. 17, 2001

(54) EPITAXIAL GROWTH FURNACE

(75) Inventors: Masato Imai; Masanori Mayusumi, both of Annaka; Shinji Nakahara, Takasaki; Kazutoshi Inoue, Maebashi, all of (JP)

(73) Assignee: Super Silicon Crystal Research Institute Corp., Annaka (JP)

( * ) Notice: Subject to any disclaimer, the term of this patent is extended or adjusted under 35 U.S.C. 154(b) by 0 days.

(21) Appl. No.: 09/554,231

(22) PCT Filed: Nov. 13, 1998

(86) PCT No.: PCT/JP98/05128

§ 371 Date: Oct. 16, 2000

§ 102(e) Date: Oct. 16, 2000

(87) PCT Pub. No.: WO99/25909

PCT Pub. Date: May 27, 1999

(30) Foreign Application Priority Data

Nov. 14, 1997 (JP) .................................................... 9/329689
Nov. 14, 1997 (JP) .................................................... 9/329690

(51) Int. Cl.[7] .................................................... F27B 5/14
(52) U.S. Cl. ......................... 219/390; 219/405; 219/411; 118/724; 118/50.1
(58) Field of Search ..................................... 219/390, 405, 219/411; 118/724, 725, 50.1; 392/416, 418

(56) References Cited

FOREIGN PATENT DOCUMENTS

| 0 381 247 | 8/1990 | (EP) . |
|---|---|---|
| 2-241029 | 9/1990 | (JP) . |
| 8-236463 | 9/1996 | (JP) . |

*Primary Examiner*—Philip H. Leung
*Assistant Examiner*—Shawntina Fuqua
(74) *Attorney, Agent, or Firm*—Frishauf, Holtz, Goodman, Langer & Chick, P.C.

(57) ABSTRACT

An epitaxial growth furnace comprising first and second partition walls arranged within a reaction chamber, a first separate space surrounded by the partition walls and the inner wall surface of the reaction chamber, a second separate space partitioned by the partition walls so as to be isolated from the inner wall surface of the reaction chamber, a holding mechanism adapted to hold a pair of semiconductor wafers respectively on the first and second partition walls so that the principal surfaces of the pair of wafers face each other with spacing therebetween and are also exposed to the second separate space, and a pair of heaters for respectively irradiating radiant heat to the back surfaces of the two wafers.

7 Claims, 4 Drawing Sheets

EPITAXIAL GROWTH FURNACE

This application is the United States National Phase application of International Application PCT/JP98/05128 filed Nov. 13, 1998.

TECHNICAL FIELD

The present invention relates to an epitaxial growth furnace for effecting the epitaxial growth of layers on the surfaces of semiconductor wafer substrates.

BACKGROUND ART

As to the silicon epitaxial growth methods, the H—Si—Cl type chemical vapor deposition (CVD) process has been most widely studied at present and put in practical applications. The process is such that a silicon source gas is supplied by means of a hydrogen carrier onto a silicon substrate heated to an elevated temperature and a silicon single crystal is deposited and grown on the substrate through the reaction of the H—Si—Cl vapor. The common silicon source gases are $SiCl_4$, $SiHCl_3$, $SiH_2Cl_2$ and $SiH_4$.

Various types of furnaces have heretofore been used as the growth furnaces for effecting such epitaxial growth. For instance, single wafer type apparatus may be mentioned as the ones which are meritorious for the realization of semiconductor wafers of greater diameter. This type is designed so that a substrate is loaded on a susceptor within a chamber heated by a radiation heating system using halogen lamps and a reaction gas is supplied into the chamber. Owing to the single wafer processing, this type has the effect of not only making the chamber more compact but also simplifying the designing of heating conditions, gas flow distribution, etc., and ensuring higher uniformity of the epitaxial film characteristics.

Thus, the above-mentioned conventional epitaxial growth methods and apparatus are all such that after wafer substrates have been heated in a reference gas atmosphere, e.g, hydrogen atmosphere while being loaded on susceptors in a chamber, a source gas is newly released into the reference gas and supplied onto the wafer surfaces thereby producing a reaction gas consisting of a mixture of the reference gas and the source gas and starting the growth.

However, in accordance with the above-mentioned method of heating from one side, i.e., the heating from the back side by the heat conduction from the susceptor, a temperature difference is caused between the surface and back sides of the semiconductor wafer. The occurrence of such temperature difference between the sides of the wafer causes a greater thermal expansion of one side than the other side thereby causing warpage and hence temperature variations in the radial direction of the wafer. This thermal stress tends to result in a slip in the crystal and irregularities in the wafer surface thus leading to the occurrence of defects due to the so-called crystal slip.

Thus, in order to avoid such temperature difference between the sides of a wafer tending to cause a warp or slip defect in the wafer, there has been proposed a method of performing a radiation heating by lamps from the sides of a wafer and this method is not practical since it tends to make the apparatus greater and more bulky.

On the other hand, in the case of the epitaxial growth furnace, a silicon source gas which is supplied along with a reference gas, e.g., hydrogen gas into the furnace reaction chamber toward the surfaces of semiconductor wafers, is also caused to flow along the inner wall surface of the chamber thus causing deposition of a silicon product due to the reaction gas on the inner wall surface of the chamber. While the reaction chamber wall is generally made from quartz, as the silicon deposit on the chamber inner wall surface accumulates, the chamber wall is shielded from light and also the amount of radiant heat irradiated from the heating means and transmitted through the chamber wall is varied and decreased with time thereby giving rise to the danger of failing to maintain uniform the heating temperature of the semiconductor wafers disposed within the chamber and failing to effect the desired satisfactory epitaxial growth.

In addition, such deposit has the danger of causing variations among different semiconductor wafers even in the case of the epitaxial growth under the same conditions and also causing the deposit in the chamber inner wall surface area located above the semiconductor wafers to fall on the semiconductor wafer surfaces and result in the occurrence of defects when it peels off the wall. Thus, there arises the need for the removing operation of the deposit on the inner wall surface prior to the loading of semiconductor wafers into the chamber. Thus, the deposit on the chamber inner wall surface requires extra time and labour for the maintenance of a given quality for wafers and prevents improvements in the operating efficiency and productivity.

In view of the foregoing deficiencies, it is the primary object of the present invention to obtain an excellent epitaxial growth furnace capable of excellent epitaxial growth of films on the semiconductor wafer surfaces without causing any defect. It is thus an object of the invention to provide an epitaxial growth furnace so designed that when heating the semiconductor wafers during epitaxial growth, despite its simple construction, the temperature difference caused between the sides of the wafers can be considerably reduced than previously and also not only the deposition of a silicon product on the chamber inner wall surface can be prevented but also redeposition of the silicon product on the semiconductor wafer surfaces can be avoided.

DISCLOSURE OF INVENTION

An epitaxial growth furnace according to the present invention, which effects the precipitation growth of an Si epitaxial layer through the reduction or thermal decomposition of a reaction gas on a principal surface of each of a plurality of semiconductor wafers under the application of a high temperature within a reaction chamber, comprises:

partition wall means arranged inside the reaction chamber, holding means for holding a plurality of semiconductor wafers on said partition wall means, and heating means for heating said wafers held by said holding means from the back side of said principal surface of each of said wafers, said partition wall means defining, within said reaction chamber, a first separate space surrounded by said partition wall means and the inner wall surface of said reaction chamber and a second separate space partitioned by said partition wall means so as to be isolated from the inner wall surface of said reaction chamber, and including a first partition wall and a second partition wall facing each other through said second separate space, said holding means including holding mechanisms for separately holding at least one of said wafers on each of said first and second partition walls such that the principal surface of each of the wafers held on said first partition wall faces the principal surface of each of the wafer held on said second partition wall while both the principal surfaces being exposed to said second separate space and spaced apart from each other, and said heating means including a pair of heaters each adapted to irradiate radiant heat to one of said oppositely arranged wafers from the back side thereof.

In accordance with the present invention, a plurality of semiconductor wafers arranged within the reaction chamber with their principal surfaces facing each other at a distance therefrom are heated by the pair of heaters each adapted to irradiate radiant heat to the back side of the principal surface of each of the wafers, with the result that each one of the oppositely arranged semiconductor wafers has its back surface heated by the radiant heat from one of the pair of heaters and it also has its principal surface heated by the radiant heat from the other of the pair of heaters through the other of the oppositely arranged wafers.

In this way, each of the oppositely arranged two wafers is heated by one of the heaters in a manner that its back surface is directly heated by the radiant heat from the heater and simultaneously its principal surface is heated by the radiant heat irradiated through the other opposing wafer. No large temperature difference is caused between the principal surface side and the back surface side as in the case of the conventional heating effected from the one side only. Thus, in accordance with the epitaxial growth furnace of the present invention, there is the effect of preventing the occurrence of warpage and slip defect in semiconductor wafers and thereby ensuring excellent epitaxial growth.

Further, in accordance with the present invention the first and second partition walls arranged within the reaction chamber define, inside the reaction chamber, the first separate space surrounded by the partition walls and the inner wall surface of the reaction chamber and the second separate space partitioned so as to be isolated from the inner wall surface of the reaction chamber, and a plurality of semiconductor wafers are each held on one of the partition walls by one of the holding mechanisms in such a manner that the wafers face each other while exposing their principal surfaces to the second separate space.

Thus, by supplying a reaction gas containing a source gas to the second separate space alone, it is possible to simultaneously effect the epitaxial growth of films on the principal surface of each of the wafers exposed to the second separate space isolated from the chamber inner wall surface.

There is no need to supply the source gas to the first separate spaces. As a result, no reaction gas flows along the chamber inner wall surface forming the first separate spaces and the deposition of any silicon product on the chamber inner wall surface is prevented, thereby avoiding such detrimental effects as a decreasing change in the amount of the radiant heat irradiation from the heating means and the falling of the deposit from the chamber inner wall surface above the principal surfaces of the wafers.

In accordance with a preferred aspect of the present invention, the epitaxial growth furnace further includes first gas circulating means for flowing hydrogen gas or an inert gas to the first separate spaces and second gas circulating means for exclusively flowing a reaction gas containing a silicon source gas to the second separate space. In this case, in order to limit the supply of the source gas component to the second separate space alone, it is desirable that the first and second gas circulating means, preferably, as well as the respective composition gas feed means are constructed so as to be independently of one another.

As regards the exposure of each of the principal surfaces of the oppositely arranged semiconductor wafers to the second separate space, it can be easily realized by constructing, for example, in a manner that an opening is formed in each of the first and second partition walls and each of the openings is closed by the wafer held by the holding mechanism. At this time, the back sides of the wafers are exposed to the first separate space sides through the respective openings so that if the pair of heaters irradiate the radiant heat to these back sides, the wafers can be heated from the back sides more directly and efficiently and always uniformly through the reaction chamber walls which are free of the deposition of any silicon deposit.

It is to be noted that while the present invention dose not exclude any horizontal construction (where the wafers are loaded in the surface horizontal directions), particularly preferably it is convenient to use a vertical construction in which the first and second partition walls are arranged to face each other and a pair of wafers are vertically held by the holding mechanisms. The reason is that even if any silicon product deposited on the surrounding partition walls, particularly their regions above the vertically held wafers, are stripped off, the silicon product falls downwards straightly and prevented from depositing again on the principal surfaces of the wafers.

In accordance with another preferred aspect of the present invention, the first and second partition walls are oppositely arranged parallel to each other and the holding mechanisms are constructed so as to hold the respective wafers parallel to each other. In this case, not only the spacing between the opposing wafers can be reduced to the shortest distance, but also the reaction chamber wall surfaces and the heaters can also be arranged parallel to one another, thereby simplifying the designing of the apparatus and making it easier to attain a uniform heating condition.

In accordance with still another preferred aspect of the present invention, the first and second partition walls are vertically arranged oppositely in inclined positions with symmetrical inclination angles with respect to each other and the holding mechanisms are constructed so as to vertically hold the respective wafers in inclined positions with symmetrical inclination angles with respect to each other. In this case, it is preferable to construct so that the oppositely arranged wafer surfaces are placed in inclined positions opening toward the upstream side of a reaction gas flow and this has the effect of improving the contact ratio of the reaction gas flow with the wafer surfaces and ensuring an improvement in the efficiency of epitaxial growth as well as the stable growth. For example, where the reaction gas flows from the upper part of the chamber toward its lower part, the opened inclined positions mean such positions that the upper end side spacing of the wafers is wider than the lower end side spacing.

It is to be noted that in the case of this inclined opposing arrangement, the holding mechanisms can be conveniently provided by such means which attach a susceptor along the surface of each partition wall and the susceptors mounted in the inclined positions tend to prevent the wafers from falling off even if the wafers are simply loaded on the susceptors thus eliminating the need for providing any special falling preventing means.

If the inclination angles are excessively large, however, when any silicon product deposited on the partition wall regions located above the semiconductor wafers is stripped off, there is the danger of this silicon product being caught by the wafer principal surfaces to deposit again thereon. In addition, the radiant heat from the heaters is not readily irradiated uniformly all over the wafer back surfaces and thus the inclination angles should preferably fall within a suitable range. For instance, assuming that the desired angles are such that any fall-off deposit is allowed to continuously fall downwards along with the gas flow, the inclination angle made by the principal surface of each wafer to the vertical direction should preferably be set to 20 degrees or less and such inclination angles reduce variations in the heating by the heaters to such extent that no difficulty is caused.

BRIEF DESCRIPTION OF DRAWINGS

FIGS. 1a and 1b illustrate schematic diagrams showing the construction of an exemplary epitaxial growth furnace according to the present invention, in which FIG. 1a is a vertical-sectional side view taken along line Y—Y in FIG. 1b and FIG. 1b is a transversal-sectional view taken along line X—X in FIG. 1a.

FIG. 2 is a vertical-sectional front view taken along line Z—Z in FIG. 1a.

FIG. 3 shows a front view of the first and second side wall portions (2a, 2b) in FIG. 1a.

BEST MODE FOR CARRYING OUT THE INVENTION

First Embodiment:

An epitaxial growth furnace according to the present embodiment is a vertical type of double construction comprising a vertical reaction chamber 1 of inverted hanging bell type which is oval in transversal section, and a cylindrical inner chamber 2 of substantially rectangular sectional shape, rounded at side corners, whose long sides are provided by first and second side walls 2a and 2b respectively, constituting first and second partition walls. The first and second side walls include holding mechanisms respectively, and face each other vertically and parallely along the vertical direction. The inner chamber 2 is coaxially arranged inside the reaction chamber 1.

In this epitaxial growth furnace, the chamber A inside the inner chamber 2 defines a second separate space isolated from the inner wall surface of the reaction chamber 1 and first separate space is defined by chamber B formed by the inner wall surface of the reaction chamber 1 and the outer wall surface of the inner chamber 2.

Figure 3:
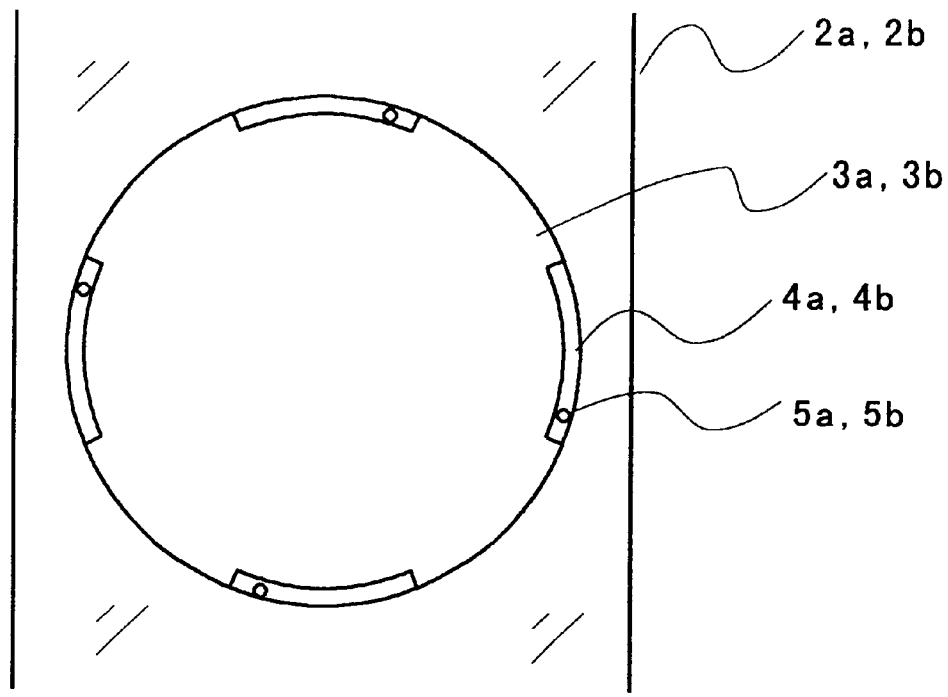

As shown in the view looked from the chamber A side (FIG. 3), the first and second side walls 2a and 2b are respectively formed with openings 3a and 3b for mounting first and second semiconductor wafers 10a and 10b through first and second susceptors 6a and 6b, respectively. When the first and second susceptors 6a and 6b respectively holding the first and second wafers 10a and 10b are respectively engaged with the openings 3a and 3b, the first and second wafers 10a and 10b are held in position in such a manner that their principal surfaces face each other vertically and parallely and they are also exposed into the chamber A or the second separate space. At this time, the back surfaces of the wafers are exposed into the chamber B and they also face the inner wall surface of the reaction chamber 1.

Figure 1A:
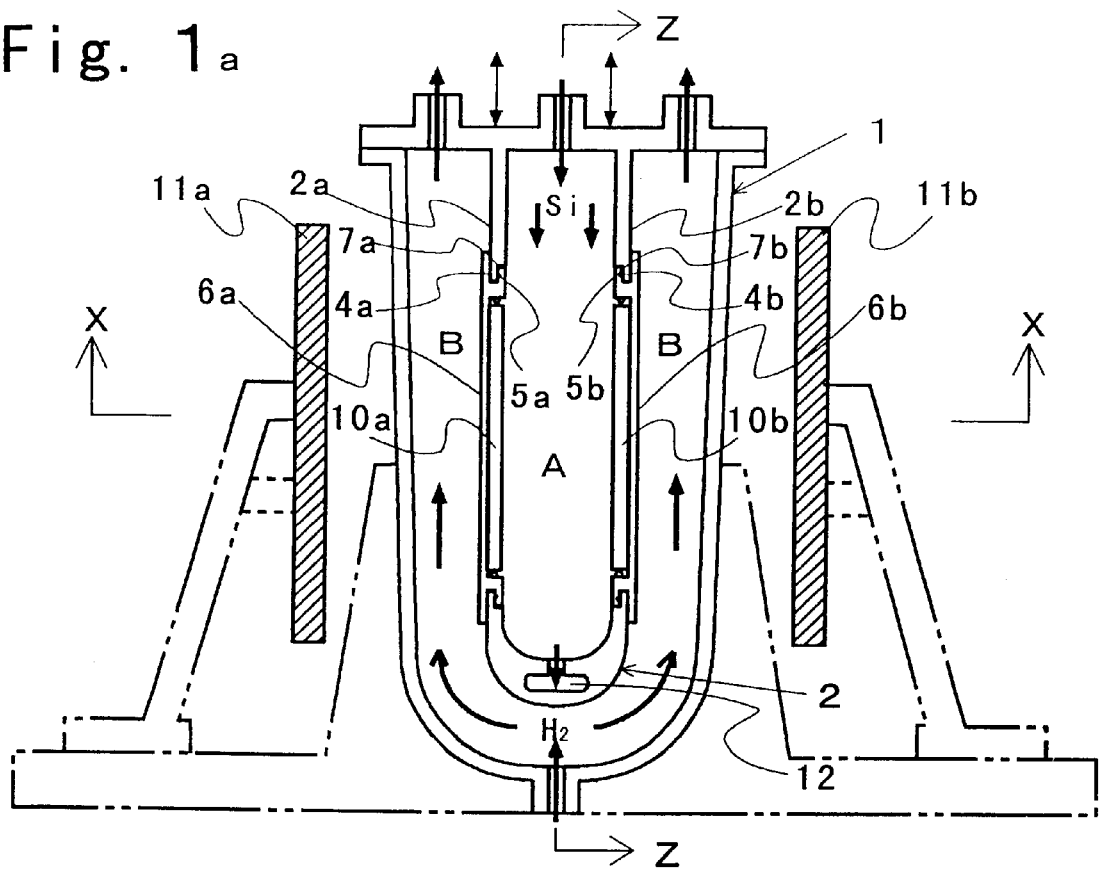
Figure 1B:
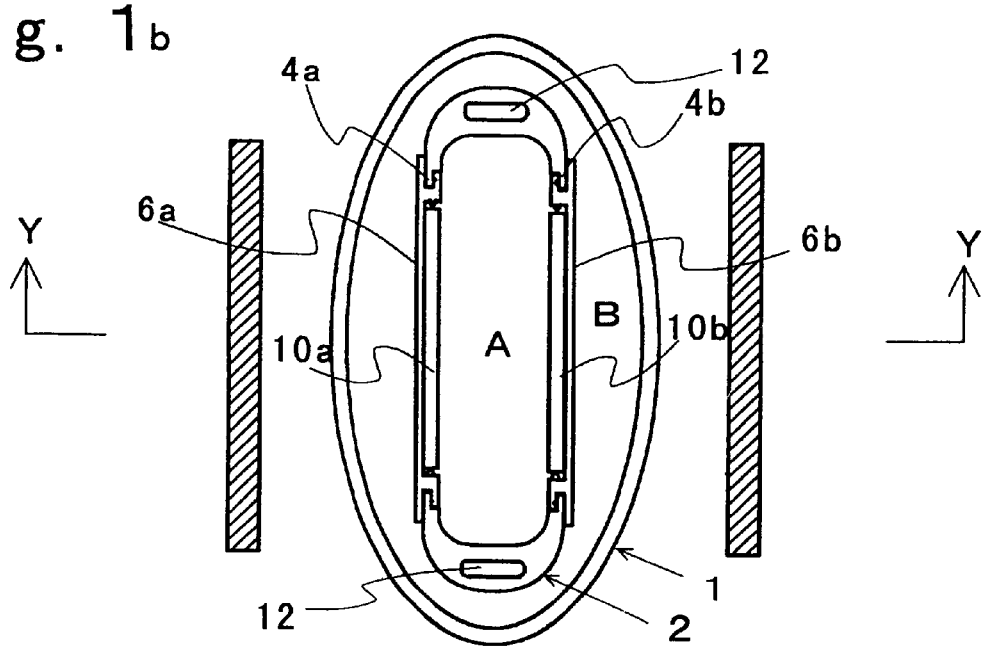
Figure 4:
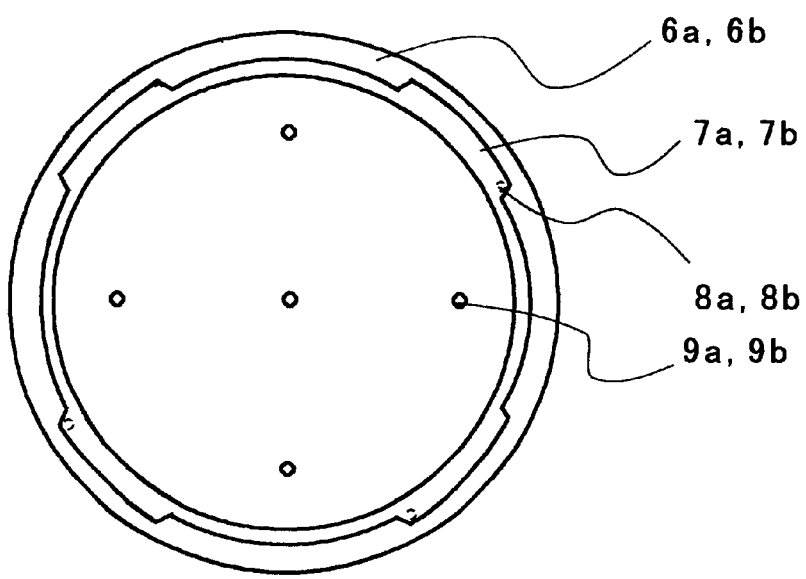
FIG. 4 shows a front view of the susceptor portions (6a, 6b).

In this case, the so-called bayonet mechanism is used as the means for engaging the susceptors 6a and 6b with the respective openings 3a and 3b. In other words, as shown in FIG. 4, the susceptors 6a and 6b are respectively formed with pluralities of pawls 7a and 7b at the equal angular intervals on the outer peripheries of their wafer holding areas, and the openings 3a and 3b are protrusively formed along the inner peripheries thereof with the same number of strip pieces 4a and 4b as the pawls at the equal angularly spaced positions corresponding to the arrangement of the pawls 7a and 7b on the susceptor side. As also shown in FIG. 1a, the pawls 7a and 7b and the strip pieces 4a and 4b are of such cross-sectional shapes that they engage with each other and are slidable in the engaged condition of the susceptors.

When engaging the susceptors, with the pawls 7a and 7b and the strip pieces 4a and 4b placed in the alternate positions on the plane, the first and second susceptors 6a and 6b are respectively fitted in the openings 3a and 3b from the chamber B side to the chamber A side and are rotated in the given direction. In response to this rotation, the pawls 7a and 7b are slid along the corresponding strip pieces 4a and 4b.

Also, spring-type lock pins 5a and 5b are respectively provided on one end side of the surfaces (the chamber A side) of the strip pieces 4a and 4b and formed on one end side of the back surfaces (the chamber B side) of the pawls 7a and 7b are slots 8a and 8b which are engageable with the lock pins 5a and 5b whereby when the sliding of the pawls 7a and 7b along the strip pieces 4a and 4b proceeds, they are engaged with each other when the slots 8a and 8b of the pawls are positioned on the corresponding lock pins 5a and 5b, thereby attaining the engagement of the first and second susceptors 6a and 6b with the respective openings 3a and 3b.

It is to be noted that the first and second susceptors 6a and 6b are respectively formed with pluralities of suction ports 9a and 9b in the bottom surfaces on which the first and second wafers 10a and 10b are loaded, so that during the operation of engaging the susceptors 6a and 6b with the openings 3a and 3b, the susceptors 6a and 6b are handled by robot arms (not shown) which cause the susceptors as well as the wafers to stick fast by suction from the back sides of the susceptors.

In this way, when the first and second susceptors 3a and 3b are, along with the first and second wafers 10a and 10b, brought into engagement with the openings 3a and 3b through the door (not shown) of the reaction chamber by the robot arms, that is, when the openings 3a and 3b of the first and second wafer mounting walls 2a and 2b are closed, the reaction chamber 1 is completely separated into the chambers A and B so that these chambers can be separately closed and also the atmospheres in these chambers can be controlled separately.

Then, if a negative pressure is produced in the chamber B with respect to the chamber A, even after the release from the chucking of the robot arms, the first and second wafers 10a and 10b are chucked respectively to the chamber B sides through the suction ports 9a and 9b in the bottom surfaces of the susceptors 6a and 6b and the wafers are fixedly held on the susceptors.

As long as the negative pressure condition of the chamber B is maintained, the first and second wafers 10a and 10b are held vertically and parallely within the chamber 1 through the susceptors 6a and 6b in a manner that the principal surfaces of the wafers face each other. On the other hand, a pair of heaters or first and second heaters 11a and 11b for respectively irradiating radiant heat to the wafers 10a and 10b from the back sides thereof, are arranged on the outer sides of the chamber 1. The heaters 11a and 11b are arranged in such a manner that each of the heaters not only faces the back surface of one of the wafers but also faces the principal surface of the other of the wafers.

As a result, the first heater 11a heats the first wafer 10a from the back side and it also heats the second wafer 10b from the principal surface side to be treated, whereas the second heater 11b heats the second wafer 10b from the back side and it also heats the first wafer 10a from the principal surface side to be treated. In other words, each of the wafers 10a and 10b is heated from the both sides and thus no large temperature difference is caused between the sides of each wafer as is the case with the conventional heating effected from one side only. In addition, the radiant heat irradiating surface of each heater is parallel to the back surfaces of the corresponding susceptor and wafer and thus each wafer is uniformly heated all over the sides.

Figure 2:
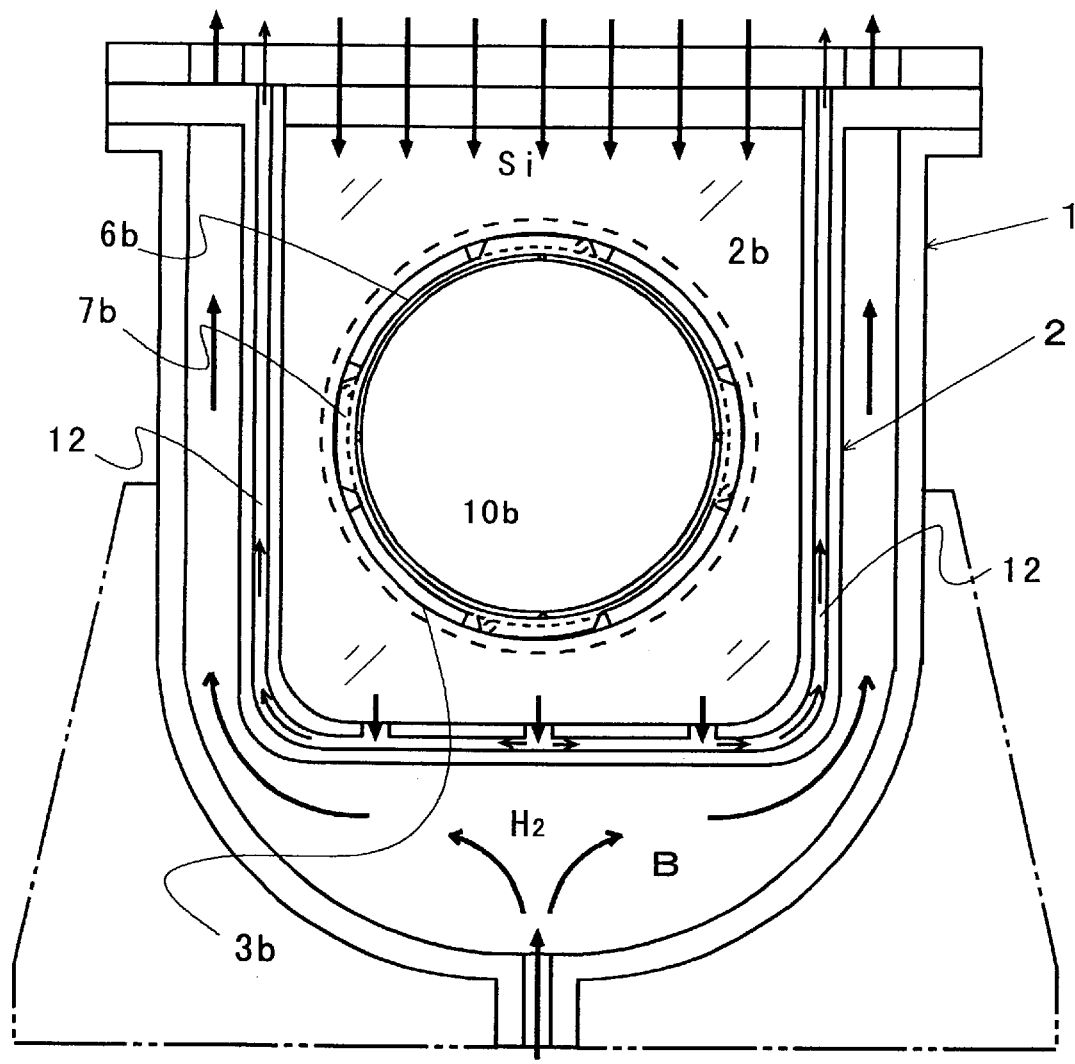

On the other hand, disposed above the reaction chamber 1 is second gas circulating means (not shown) for supplying a laminar flow of a reaction gas containing a source gas into the chamber A only from above to below and disposed below the reaction chamber 1 is first gas circulating means (not shown) for supplying only hydrogen gas into the chamber B from the bottom of the reaction chamber 1 from below to above. It is to be noted that in the present embodiment, as shown in FIG. 2, provided in each of the side walls of the inner chamber 2 is a flow path 12 whereby the reaction gas supplied from above the chamber A is fed upward from the bottom along the side walls and discharged to the outside of the reaction chamber 1. Further, the supply of the hydrogen gas can be directed either from below to above or from above to below and the selection can be made suitably depending on the apparatus designing.

With the epitaxial growth furnace constructed as mentioned above, in the first place the first and second susceptors 6a and 6b chucked, along with the first and second wafers 10a and 10b, by the previously mentioned robot arms are respectively fitted into engagement with the first and second openings 3a and 3b from the chamber B side and the pressure in the chamber B is made negative relative to that in the chamber A whereby the wafers 10a and 10b are chucked and fixedly held in position by the respective susceptors even after the releasing of the chucking by the robot arms.

With the first and second wafers 10a and 10b maintained in the fixedly held positions, the heating by the first and second heaters 11a and 11b is effected and the wafers are heated up to the temperature required for the epitaxial growth conditions. When the given temperature is attained, the first and second gas circulating means are driven into operation so that the hydrogen gas is supplied to the chamber B from below to above and the reaction gas laminar flow is supplied to the chamber A from above to below, thereby starting the epitaxial growth.

During the time that the epitaxial growth operation is continued, the first and second wafers 10a and 10b are heated from both sides thereof by the first and second heaters 11a and 11b, thereby greatly reducing the temperature difference between the both sides of each wafer, preventing the occurrence of any warpage in the wafers, avoiding even the occurrence of any slip and facilitating the satisfactory epitaxial growth.

Further, in accordance with the epitaxial growth furnace of the present embodiment, as the epitaxial growth proceeds, only the hydrogen gas through the first gas circulating means contacts with the inner wall surface of the reaction chamber 1 and there is no flow of the reaction gas containing the source gas, thus preventing the deposition and accumulation of any silicon product on the inner wall surface of the chamber 1. As a result, there is the effect that any detrimental effect due to such deposit is avoided, that the occurrence of variations in the amount of radiant heat from the heaters is prevented and that a uniform heating condition at a constant temperature is always ensured, thereby making the formation of epitaxial growth layers on the principal surfaces of the semiconductor wafers stable and satisfactory.

Further, while there are chances for the deposition of silicon product on the inner wall surface of the inner chamber 2 around the outer peripheries of the wafers, the wafers 10a and 10b are arranged vertically and also the reaction gas flow is directed from above to below, with the result that even if any silicon product is stripped off the inner wall surface of the inner chamber 2 above the wafers, the silicon product falls straightly downstream and is not deposited again on the principal surfaces of the wafers.

It is to be noted that while the construction of this embodiment is such that the pluralities of suction ports 9a and 9b are formed in the bottom surfaces of the susceptors 6a and 6b in order to hold the wafers 10a and 10b on the respective susceptors 6a and 6b and the wafers 10a and 10b are chucked through these suction ports, the present invention is not limited thereto and a wide use of other constructions are possible provided that semiconductor wafers can be removably held in the openings.

Figure 5:
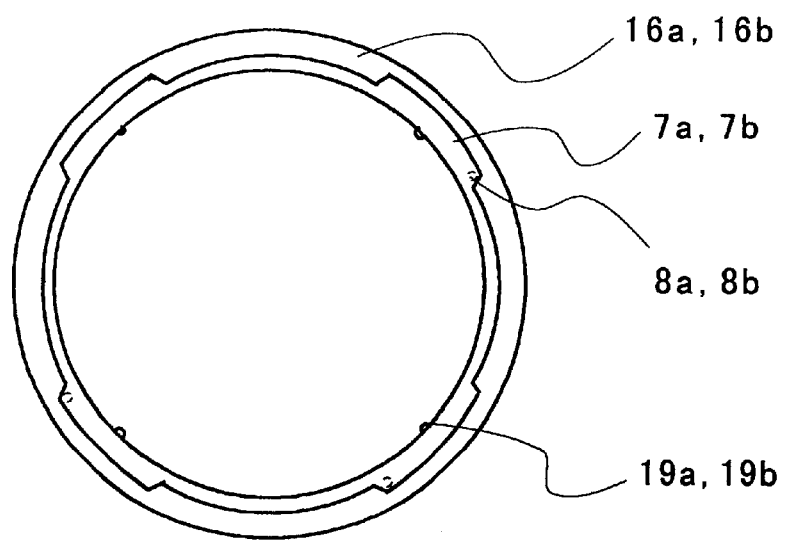
FIG. 5 shows a front view of the susceptor portions (16a, 16b) which are different in construction from those shown in FIG. 4.

For instance, it is possible to provide the susceptors themselves with holding means for holding the respective semiconductor wafers. More specifically, one such construction may be cited in which a plurality of spring-type press members 19a, 19b for pushing the wafer outer peripheral walls are disposed along the periphery of the wafer loading area of the respective susceptors 16a and 16b as shown in FIG. 5.

Figure 6:
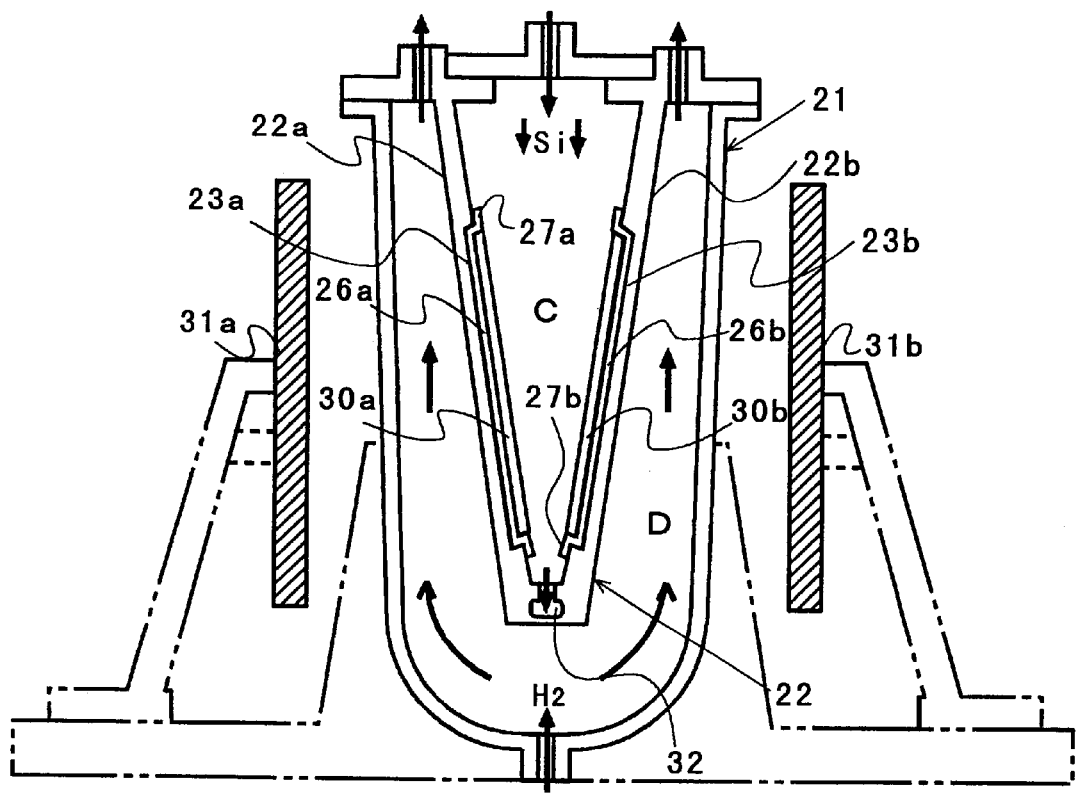
FIG. 6 is a schematic vertical-sectional side view showing another embodiment of the epitaxial growth furnace according to the present invention.

Second Embodiment:

Referring to FIG. 6, there is illustrated a second embodiment of the present invention which consists in an epitaxial growth furnace so constructed that the desired epitaxial growth is effected by arranging a pair of semiconductor wafers in inclined positions with symmetrical angles of inclination to the vertical direction. As in the case of the first embodiment, the epitaxial growth furnace according to the present embodiment comprises wafer holding mechanisms on the side walls of a cylindrical inner chamber 22 arranged within a vertical type reaction chamber 21 which is oval in transversal section and having an inverted hanging bell shape.

In other words, it is constructed so that the inner chamber 22 has a shape which is reduced in diameter in its transversal area including at least the susceptor mounting portions 23a and 23b of the opposing side walls and the first and second side walls 22a and 22b are arranged in inclined positions thus making the spacing therebetween greater in the upper part than in the lower part. In this embodiment, the second separate space is formed by a chamber C within the inner chamber 22 and the first separate space is formed by a chamber D defined by the inner wall surface of the cylindrical reaction chamber 21 and the outer wall surface of the inner chamber 22.

The first and second side walls 22a and 22b are formed, as the first and second susceptor mounting portions 23a and 23b, with recesses shaped to substantially correspond to the susceptor bottom portions so as to receive the susceptors 26a and 26b from the back sides thereof and also the first and second susceptors 26a and 26b are formed on the outer peripheries thereof with projections 27a and 27b which engage with the recess outer peripheral edges of the susceptor mounting portions 23a and 23b so as to be fitted in the susceptor mounting portions 23a and 23b of the inclined first and second side walls 22a and 22b, thereby ensuring the stable mounting of the suscepters without any special engaging means.

From the foregoing it will be seen that wafers 30a and 30b loaded on the susceptors 26a and 26b fitted in the susceptor mounting portions 23a and 23b in the inclined manner, are prevented from falling downward by virtue of this inclination. The wafers have their principal surfaces exposed into the chamber C within the inner chamber 22 and are held so as to be isolated from the inner wall surface of the reaction chamber 21. As a result, there is no need to especially provide such press members, chuck means, etc., for wafer holding purposes as in the case of the first embodiment. In particular, there is no need to sealingly separate the interior of the reaction chamber and effect its pressure-reducing adjustment for the chucking of semiconductor wafers.

As in the case of the first embodiment, arranged on the outer side of the reaction chamber 21 are a first heater 31a for heating the first wafer 30a from the back side and also heating the second wafer 30b from the principal surface side and a second heater 31b for heating the second wafer 30b from the back side and also heating the first wafer 30a from the principal surface side.

It is to be noted that the previously mentioned angles of inclination are selected to be substantially 20 degrees or less to the vertical direction. The reason is that if the inclination angles are selected greater than this limit, there is the danger of not only spreading the occupied space in the horizontal direction and increasing the size of the reaction chamber 21 in the width direction, but also causing the vertical variations in the distance between the wafers and the heaters depending on the inclination of the wafers thus making the uniform heating difficult and causing temperature variations in the same wafer. Particularly, in the case of wafers of such large diameters as 300 mm and 400 mm or more, the wafer spacing in the upper part is increased greatly with increase in the inclination angles and it is not an easy matter for the construction of apparatus for supplying a uniform reaction gas as a laminar flow.

In addition, disposed above the reaction chamber 21 is second gas circulating means (not shown) for supplying the laminar flow of reaction gas only into the chamber C from above to below and also disposed below the reaction chamber 21 is first gas circulating means (not shown) for supplying only hydrogen gas from the bottom into the chamber D from below to above; and the inner chamber 22 is formed with a flow path 32 whereby the reaction gas supplied from above the chamber C is fed from the bottom portion upwardly along the side walls and discharged to the outside of the reaction chamber 21.

With the epitaxial growth furnace constructed as described above, as for example, the first and second susceptors 26a and 26b respectively having the wafers 30a and 30b loaded thereon can be set in an inclined manner in the susceptor mounting portions 23a and 23b within the inner chamber 22 by means of robot arms or the like.

With the inner chamber 22 in which the wafers 30a and 30b have been set in the first and second susceptors in the inclined manner, the reaction chamber 21 is moved upward so as to relatively insert the under chamber 22 into the reaction chamber 21 and then the wafers are respectively heated up to the temperature required for the desired epitaxial growth conditions by the first and second heaters 31a and 31b, thus starting the supply of the reaction gas and thereby starting the epitaxial growth of layers on the wafer principal surfaces.

According to the present embodiment, while the wafers 30a and 30b are placed in the inclined positions with respect to the vertical direction, this condition is such that no considerable variations in the heating by the heaters will be caused in the vertical direction and, due to the fact that the wafers are heated substantially uniformly from the both sides by the oppositely arranged two heaters, the temperature difference between the sides of each wafer is reduced thus eliminating the occurrence of warpage and slip in the wafers and thereby proceeding the satisfactory epitaxial growth.

Further, as the epitaxial growth proceeds, the inner wall surface of the reaction chamber 1 is contacted only with the hydrogen gas from the first gas circulating means and no reaction gas containing the source gas flows, thus preventing the deposition and accumulation of any silicon product on the inner wall surface of the chamber 1. As a result, there is the effect of avoiding any detrimental effect due to such deposit, preventing the occurrence of variations in the amount of irradiated radiant heat from the heaters and ensuring always the uniform heating condition at a constant temperature, thereby making the formation of epitaxial growth layers on the principal surfaces of the semiconductor wafers stable and satisfactory.

We claim:

1. An epitaxial growth furnace for effecting precipitation growth of Si epitaxial layers through the reduction or thermal decomposition of a reaction gas on a principal surface of each of a plurality of semiconductor wafers under an elevated temperature within a reaction chamber, comprising:

partition wall means arranged inside the reaction chamber;

holding means for holding a plurality of semiconductor wafers on said partition wall means; and heating means for heating said wafers held by said holding means from the back side of said principal surface of each of said wafers, said partition wall means defining, within said reaction chamber, a first separate space surrounded by said partition wall means and the inner wall surface of said reaction chamber and a second separate space partitioned by said partition wall means so as to be isolated from the inner wall surface of said reaction chamber, and including a first partition wall and a second partition wall facing each other through said second separate space, said holding means including holding mechanisms for separately holding at least one of said wafers on each of said first and second partition walls such that the principal surface of each of the wafers held on said first partition wall faces the principal surface of each of the wafer held on said second partition wall while both the principal surfaces being exposed to said second separate space and spaced apart from each other, and said heating means including a pair of heaters each adapted to irradiate radiant heat to one of said oppositely arranged wafers from the back side thereof.

2. The epitaxial growth furnace according to claim 1, further comprising first gas circulating means for feeding a flow of hydrogen gas or inert gas containing no silicon source gas to said first separate space, and second gas circulating means for exclusively feeding a flow of reaction gas containing a silicon source gas to said second separate space.

3. The epitaxial growth furnace according to claim 1, wherein said first and second partition walls include openings adapted to be respectively closed by the wafers held by said holding mechanisms.

4. The epitaxial growth furnace according to claim 3, wherein each of said pair of heaters irradiates radiant heat to said wafers through corresponding one of said openings.

5. The epitaxial growth furnace according to claim 1, wherein said first and second partition walls are vertically arranged to face each other, and wherein each of said holding mechanisms vertically holds one of said wafers.

6. The epitaxial growth furnace according to claim 5, wherein said first and second partition walls are oppositely arranged parallel to each other, and wherein said holding mechanisms hold said wafers parallel to each other.

7. The epitaxial growth furnace according to claim 5, wherein said first and second partition walls are oppositely arranged obliquely with respect to each other at symmetrical angles of inclination to a vertical direction, and wherein said holding mechanisms hold said wafers in inclined positions with respect to each other at symmetrical angles of inclination to said vertical direction.

\* \* \* \* \*